United States Patent
Zhang et al.

(10) Patent No.: US 7,448,003 B2
(45) Date of Patent: Nov. 4, 2008

(54) SIGNAL FLOW DRIVEN CIRCUIT ANALYSIS AND PARTITIONING TECHNIQUE

(75) Inventors: Pengfei Zhang, Fremont, CA (US);
Xisheng Zhang, Sunnyvale, CA (US);
Yuping Wu, Beijing (CN)

(73) Assignee: Magma Design Automation, Inc., Santa Clara, CA (US)

( * ) Notice: Subject to any disclaimer, the term of this patent is extended or adjusted under 35 U.S.C. 154(b) by 62 days.

(21) Appl. No.: 11/452,542

(22) Filed: Jun. 13, 2006

(65) Prior Publication Data
US 2007/0006103 A1 Jan. 4, 2007

Related U.S. Application Data

(63) Continuation of application No. 10/762,790, filed on Jan. 23, 2004, now abandoned.

(60) Provisional application No. 60/442,306, filed on Jan. 27, 2003.

(51) Int. Cl.
*G06F 17/50* (2006.01)

(52) U.S. Cl. ................ 716/4; 716/1; 716/5; 716/6; 716/7

(58) Field of Classification Search ............. 716/4, 716/5, 6, 7, 8, 9, 10, 1

See application file for complete search history.

(56) References Cited

U.S. PATENT DOCUMENTS

| | | | | | |
|---|---|---|---|---|---|
| 4,884,036 | A | * | 11/1989 | Koyama et al. | 327/557 |
| 5,740,347 | A | * | 4/1998 | Avidan | 714/33 |
| 2002/0033706 | A1 | * | 3/2002 | Khazei | 324/750 |

OTHER PUBLICATIONS

Ramadoss et al., "Test Generation for Mixed-Signal Devices Using Flow Graphs", Jan. 1996, Ninth International Conference on VLSI Design, Proceedings, pp. 242-248.*
Olbrich et al., "An Improved Hierarchical Classification Algorithm for Structural Analysis of Integrated Circuit", Mar. 2001, IEEE Design, Automation and Test in Europe Conference and Exhibition, Proceedings, pp. 829.*
Sommer et al., "From System Specification To Layout: Seamless Top-Down Design Method for Analog and Mixed-Signal Applications" 2002, IEEE Design, Automation and Test in Europe Conference and Exhibition, Proceeding pp. 884-891.*

* cited by examiner

*Primary Examiner*—Sun J Lin
(74) *Attorney, Agent, or Firm*—Townsend and Townsend and Crew LLP

(57) ABSTRACT

A method for generating a layout for an analog circuit design is provided. The method includes tracing a signal flow through a circuit netlist, and partitioning the circuit netlist into a digital portion and an analog portion. A signal flow is defined through the analog portion of the circuit netlist. A system for generating a layout for an analog circuit design is also included.

18 Claims, 6 Drawing Sheets

SIGNAL FLOW DRIVEN CIRCUIT ANALYSIS AND PARTITIONING TECHNIQUE

CROSS-REFERENCE TO RELATED APPLICATIONS

This is a continuation application based on U.S. patent application Ser. No. 10/762,790 filed Jan. 23, 2004 now abandoned, which claims priority to provisional patent application Ser. No. 60/442,306 filed Jan. 27, 2003.

BACKGROUND

The present invention relates generally to circuit analysis and partitioning and more specifically, to a signal flow driven circuit analysis and partitioning technique for mixed-signal circuit performance optimization, yield enhancement and layout optimization.

It should be appreciated that circuit analysis and partitioning have been in use for years with digital designs. Typically, circuit analysis and partitioning include the manual partitioning of circuit blocks based on their functionality and physical requirements during the circuit design and layout stages. For radio frequency (RF)/Analog circuit blocks, identifying the critical signal flow is either not performed or implicitly identified at the layout stages manually by layout designers. Circuit optimization is commonly performed by trial-and-error with detailed simulators, such as SPICE.

The main problem with conventional circuit analysis and partitioning is that mixed signal circuit designs often suffer sub-optimal block level partitioning or no partitioning at all due to the lack of an automated solution. This results in either compromised performance of the product or excessive physical area of the layout. Another problem with conventional circuit analysis and partitioning is that massive numerical simulations are needed to optimize the performance of the circuit. Simulation can be so prohibitively time and/or computation power intensive, that performance optimization may not be feasible for a certain scale of circuits. Yet another problem with conventional circuit analysis and partitioning is the difficulty to assure high quality layout, as it is up to the layout designer to manually identify the critical signal path during the layout stage, which is largely dependent on designers' experience level and is susceptible to errors.

In these respects, the signal flow driven circuit analysis and partitioning technique according to the present invention substantially departs from the conventional concepts and designs of the prior art, and in so doing provides an apparatus primarily developed for the purpose of mixed signal circuit performance optimization, yield enhancement and layout optimization.

SUMMARY

In view of the foregoing disadvantages inherent in the known types of circuit analysis and partitioning now present in the prior art, the present invention provides a new signal flow driven circuit analysis and partitioning technique construction wherein the same can be utilized for mixed signal circuit performance optimization, yield enhancement and layout optimization.

The general purpose of the present invention, which will be described subsequently in greater detail, is to provide a new signal flow driven circuit analysis and partitioning technique that has many of the advantages of the circuit analysis and partitioning mentioned heretofore and many novel features that result in a new signal flow driven circuit analysis and partitioning technique which is not anticipated, rendered obvious, suggested, or even implied by any of the prior art circuit analysis and partition, either alone or in any combination thereof.

To attain this, the embodiments described herein generally cover automatic partitioning of mixed signal integrated circuits based on functional blocks, automatic identification of critical signal path in analog/radio frequency (RF) circuits, automatic identification of fundamental unit circuits, and the automatic identification of matching and symmetry requirements. Circuit partition automatically partitions a mixed signal circuit into blocks based on their functionality. Automatically tracing the signal flow and identifying the critical path based on a set of rules achieve identification of the signal flow. Various building blocks of known characteristics and optimization requirements can also be automatically obtained. By tracing the signal path, matching and symmetry requirements and parasitic loading requirements at critical circuit nodes can also be automatically generated.

There has thus been outlined, rather broadly, the more important features of the invention in order that the detailed description thereof may be better understood, and in order that the present contribution to the art may be better appreciated. There are additional features of the invention that will be described hereinafter.

In this respect, before explaining at least one embodiment of the invention in detail, it is to be understood that the invention is not limited in its application to the details of construction and to the arrangements of the components set forth in the following description or illustrated in the drawings. The invention is capable of other embodiments and of being practiced and carried out in various ways. Also, it is to be understood that the phraseology and terminology employed herein are for the purpose of the description and should not be regarded as limiting.

In one embodiment, a method for generating a layout for an analog circuit design is provided. The method includes tracing a signal flow through a circuit netlist, and partitioning the circuit netlist into a digital portion and an analog portion. A signal flow is then defined through the analog portion of the circuit netlist.

In another embodiment, a system for characterizing a circuit design having an analog circuit portion and a digital circuit portion is provided. The system includes a signal flow tracking module configured to trace a signal flow through the analog circuit portion and a unit circuit module configured to characterize structure details associated with the signal flow through the analog circuit portion and determine if the characterized structure matches a unit circuit.

Other objects and advantages of the present invention will become obvious to the reader and it is intended that these objects and advantages within the scope of the present invention. To the accomplishment of the above and related objects, this invention may be embodied in the form illustrated in the accompanying drawings, attention being called to the fact, however, that the drawings are illustrative only, and that changes may be made in the specific construction illustrated.

BRIEF DESCRIPTION OF THE DRAWINGS

Various other objects, features and attendant advantages of the present invention will become fully appreciated as the same becomes better understood when considered in conjunction with the accompanying drawings, in which like reference characters designate the same or similar parts throughout the several views.

DETAILED DESCRIPTION

Figure 1A:
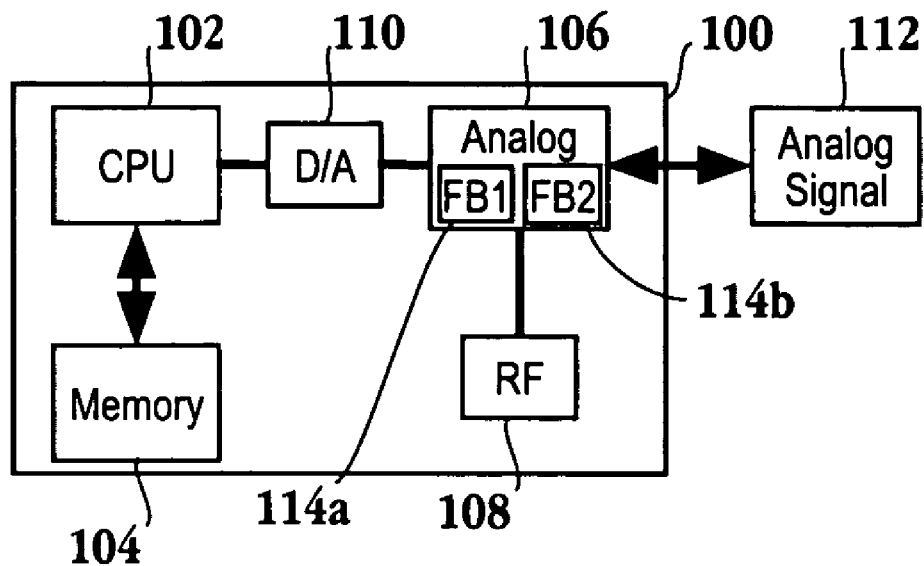
FIG. 1A is a high level schematic diagram of a simplified device having digital and analog circuitry in which a design for the device must be generated.

Turning now descriptively to the drawings, in which similar reference characters denote similar elements throughout the several views, the attached figures illustrate a signal flow driven circuit analysis and partitioning technique, which include automatic partitioning of mixed signal integrated circuits based on functional blocks, automatic identification of critical signal paths in analog/RF circuits, automatic identification of fundamental unit circuits, automatic identification of matching and symmetry requirement.

In the embodiments described herein, circuit partitioning automatically partitions a mixed signal circuit into blocks based on their functionality. Identification of signal flow is achieved by automatically tracing the signal flow to identify the critical path based on a set of rules. Various building blocks of known characteristics and optimization requirements can also be automatically obtained. By tracing the signal path, matching and symmetry requirements and parasitic loading requirements at critical circuit nodes can also be automatically generated.

First the input/output pins are identified in advance into certain classes: digital, analog signal, critical analog signal, analog biasing, and so on. Circuit partitioning is performed by tracing the input/output signals of the circuit according to a set of "tracing rules" for their respective class: Digital signals are traced from their input pin all the way through to their output pins. Generally digital gate outputs trace to other digital gate inputs which in turn fan-out to other digital gate inputs and so on. If a digital signal presents at the GATE of a MOSFET, then the SOURCE and DRAIN of this transistor is a digital node, unless it is terminated to supply rails (VCC or GND), denoted as: GATE->SOURCE/DRAIN. Accordingly, that leaves: SOURCE->DRAIN, DRAIN->SOURCE, but not SOURCE or DRAIN->GATE. On the other hand: resistors are transparent for digital signals, capacitors are open for digital, and inductors are mostly used as a tuning load in radio frequency (RF) circuits and rarely found in digital integrated circuits. With regard to the analog portion, critical analog and biasing signals will present to one of the pins of a transistor or a passive device. If an analog signal presents at the GATE of a MOSFET, then the SOURCE and DRAIN of this transistor is an analog node, denoted as: GATE->SOURCE/DRAIN. Accordingly this leaves: SOURCE->DRAIN, DRAIN->SOURCE, but not SOURCE or DRAIN->GATE. On the other hand: resistors are transparent for analog signals, capacitors and inductors are transparent for analog signals. Upon finishing of the tracing, a circuit partition is obtained. It should be appreciated that circuit partition rules can be changed to accommodate other circuit topologies or requirements.

Therefore, identification of signal flow of these identified classes is achieved by automatically tracing the signal flow to identify the critical path based on a set of rules. From this analysis, sub-circuits of the various classes may be identified as a critical analog signal, analog signal, biasing, or digital. What does not get classed is considered non-critical. These sub-circuits of the analog and critical analog signals contain the signal flow for the topology. With modified tracing rules, other circuit topologies can be accommodated.

Various building blocks of known characteristics and optimization requirement can also be automatically obtained. The embodiments automatically identify the fundamental unit circuit based on a structure representation by signal flow analysis. Unit circuits include, but are not limited to, various configurations of single stage amplifiers, current mirrors, differential pairs and voltage and current references. In one embodiment, unit circuit identification can also be achieved with pattern matching. A unit circuit can be expanded to some more complex sub-circuits.

By tracing the signal path, matching and symmetry requirements and parasitic loading requirements at critical circuit nodes can also be automatically generated. Automatic generation of physical constraints, such as matching, abutment and parasitic loading is achieved by a set of rule files as defined below. In one embodiment, it is possible to perform some simple numerical circuit simulation to enhance the constraints generation, e.g., sensitivity analysis.

All components in this invention can be performed in series or in parallel. Depending on the application, they each can be performed separately if so desired. For example, signal flow tracing and circuit partitioning can be performed in a numerical simulator. Alternatively signal flow tracing and circuit partition can be performed through a circuit synthesizer, or a stand-alone signal flow driven circuit partition tool.

Figure 1B:
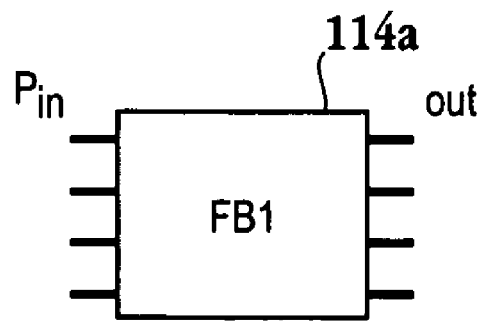
FIG. 1B is a simplified schematic illustrating further details of a functional block of FIG. 1A.

FIG. 1A is a high level schematic diagram of a simplified device having digital and analog circuitry in which a design for the device must be generated. Device 100 includes central processing unit (CPU) 102 and memory 104. In addition, device 100 includes analog block 106 and radio frequency block 108. In order to enable CPU 102 to communicate with the analog portion of device 100, a digital to analog converter 110 is included. Analog block 106 includes a number of functional blocks illustrated as FB1 114*a* and FB2 114B. The functional blocks may serve to amplify a signal, function as a bias circuit, or some other commonly performed analog operations. It should be appreciated that any number of functional blocks may be associated with analog block 106. Analog block 106 of device 100 receives an analog signal 112 from an external source. Much has been written about the automatic generation for the digital side of device 100. However, the analog side of device 100 does not have the same tools available when it comes to device simulation and physical synthesis. FIG. 1B further describes the functional block of the analog block of FIG. 1A. Functional block 114*a* is shown having a number of pins into the functional block and a number of pins out of the functional block. As will be described in more detail below, the embodiments described herein provide a method for simulating an analog block at the physical level, wherein the critical portions of the analog block and functional blocks therein are identified through the signal tracing.

Figure 2:
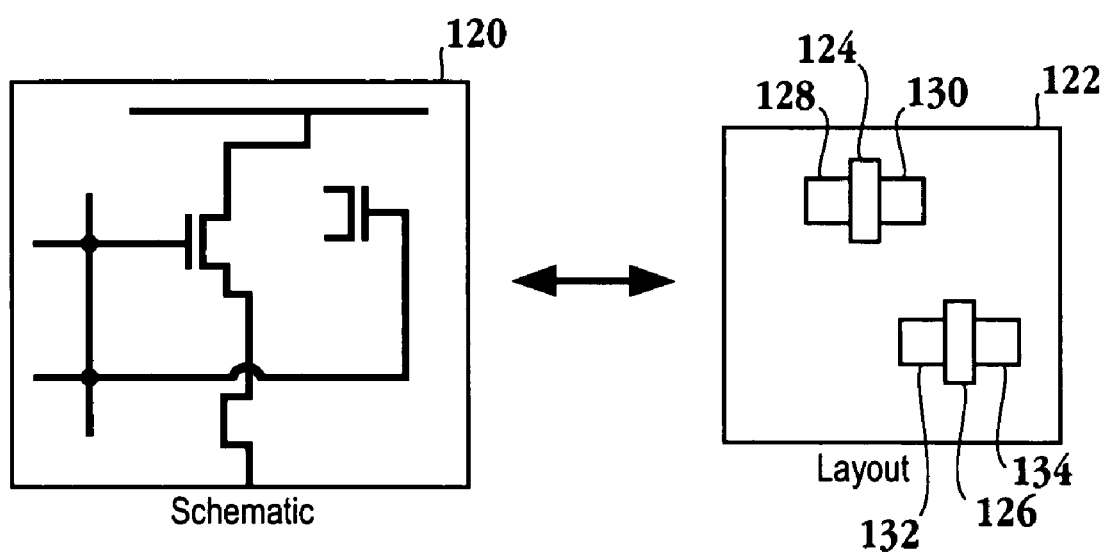
FIG. 2 is a simplified schematic diagram illustrating the conversion of a schematic diagram to a physical layout in accordance with one embodiment of the invention.

FIG. 2 is a simplified schematic diagram illustrating the conversion of a schematic diagram to a physical layout in accordance with one embodiment of the invention. Schematic diagram 120 may be provided by a netlist, which is generated through design software commercially available. This netlist is then used to generate the physical layout 122 in order to provide the eventual manufacturing of the analog circuit. In the past, the generation of the layout 122 has been manual. With the embodiments described herein, the generation of layout 122 is automated. Layout 122 illustrates gates 124 and 126. Gate 124 is associated with drain 128 and source 130, which may also be referred to as active regions. Gate 126 is associated with drain 132 and source 134. It should be appreciated that schematic diagram 120 may be stored within a database and accessed through the database so that the embodiments described herein may automatically generate the layout 122. One skilled in the art will appreciate that layout 122 may be associated with many different levels of abstraction.

Figure 3:
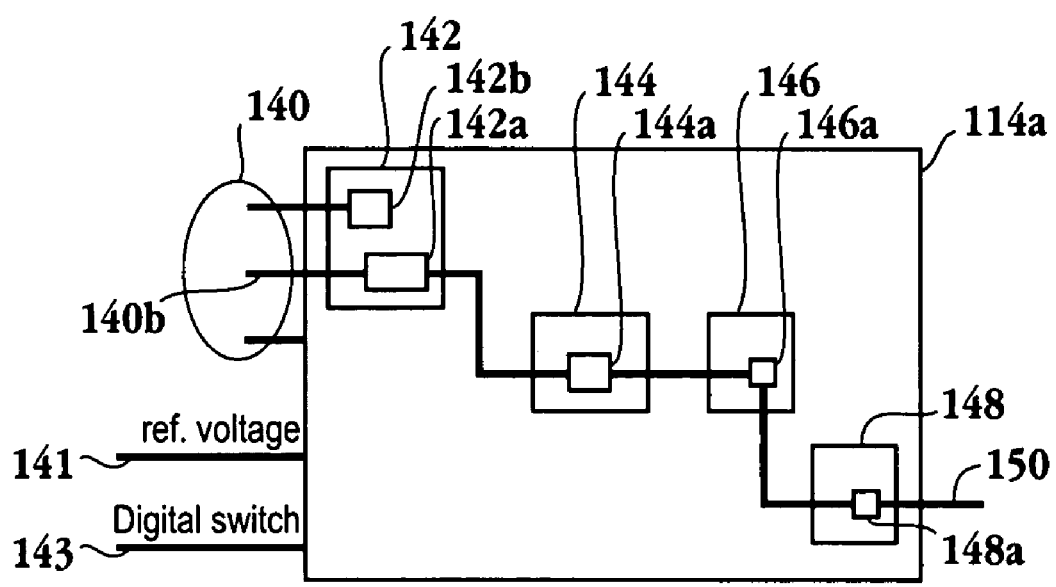
FIG. 3 is a simplified schematic diagram of a functional block within an analog circuit in accordance with one embodiment of the invention.

FIG. 3 is a simplified schematic diagram of a functional block within an analog circuit in accordance with one embodiment of the invention. Functional block 114a is shown having pins within region 140, pin 141 and pin 143. Pins within region 140, i.e., pins 140a-c are identified as critical pins, while pin 141 is a reference voltage pin and pin 143 is a digital switch. In one embodiment, a signal through the functional block 114a is traced in order to identify the signal flow. For example, from pin 140b a signal is transmitted to block 142a of module 142. From module 142a, the signal is transmitted to module 144a of module 144 and then to module 146a of module 146. The signal path continues to module 148a of module 148 and eventually leads to output pin 150. From the tracing of the signal flow, a partition for the blocks from the schematic will be generated in order to define the layout. In doing so, the critical nodes, critical nets, critical components are identified for the analog circuit in order to generate the partitioning. By tracing the signal flow for all the critical pins 140a-c, the layout may be generated according to the rules. Furthermore, the layout may be optimized with the knowledge of the signal flow through the critical pins as functionality shared by the critical pins may be optimally placed.

Figure 4:
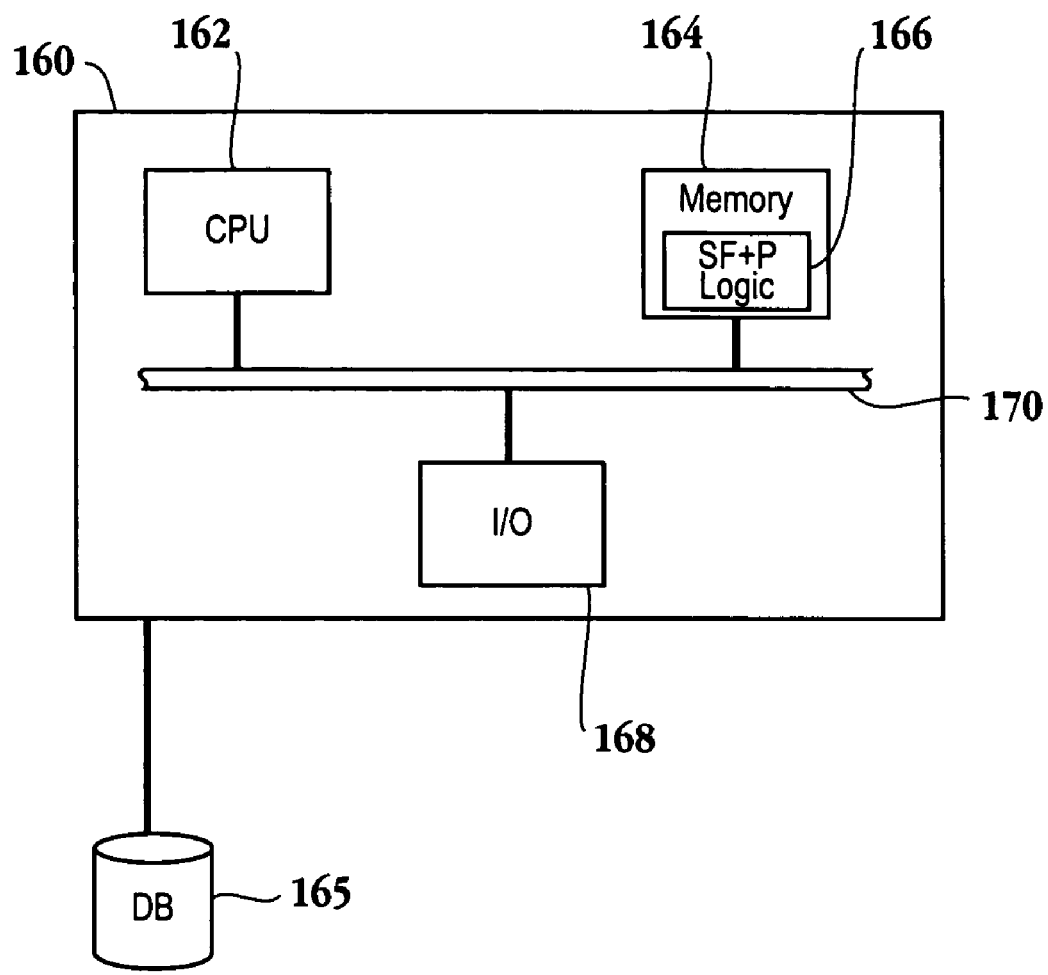
FIG. 4 is a simplified schematic diagram illustrating a system having the signal flow circuit analysis and partition logic in accordance with one embodiment of the invention.

FIG. 4 is a simplified schematic diagram illustrating a system having the signal flow circuit analysis and partition logic in accordance with one embodiment of the invention. System 160 includes CPU 162 memory 164 and input/output (I/O) 168. Memory 164 includes signal flow and partition logic 166, which accomplishes the functionality described herein. That is, signal flow and partition logic 166 will automatically generate a layout for an analog portion of a circuit design from the schematic information with reference to FIG. 2. CPU 162, memory 164, and 168 are in communication through bus 170. System 160 is in communication with database 165. As mentioned previously, database 165 may store the information associated with the schematic representation of the circuit design, as well as the rules utilized by the embodiments described herein.

Figure 5:
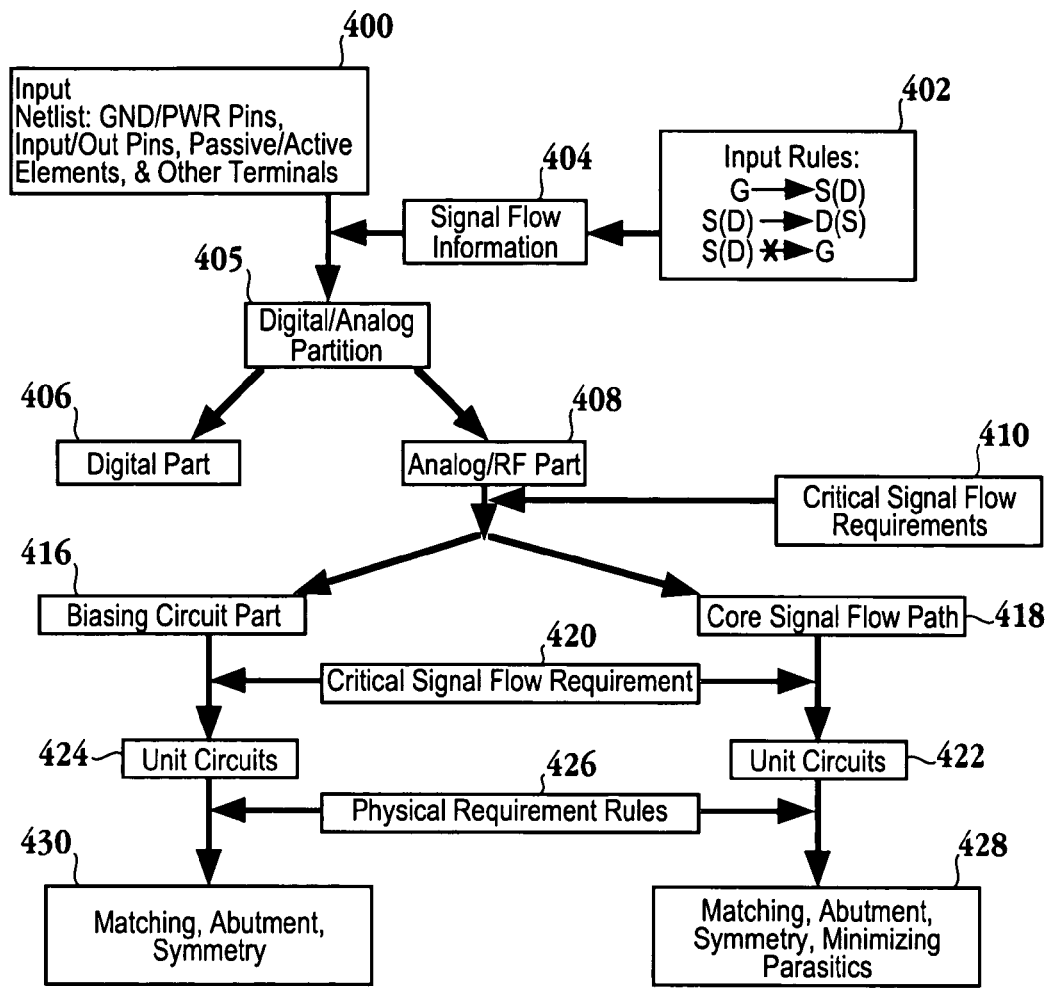
FIG. 5 is a flow chart diagram illustrating the method operations for a signal flow driven circuit analysis in accordance with one embodiment of the invention.

FIG. 5 is a flow chart diagram illustrating the method operations for a signal flow driven circuit analysis in accordance with one embodiment of the invention. In block 400 a net list is provided. One skilled in the art will appreciate that commercially available software packages, such as COM-POSE, may be used to provide the netlist, which includes information on ground and power pins, input and output pins, passive inactive elements, and other terminals. In operation 402 the input rules are provided. Here, the rules are provided in a format where a gate will lead to a source or drain, a source or drain will lead to a drain or source, and a source or drain cannot lead to a gate, as discussed above. In operation 404, the signal flow information is extracted in order to partition the digital and analog portion of the circuit in operation 405. Signal flow information is the result of signal flow analysis in which digital and analog sub-circuits are generated according to the pin classes identified and input rules provided in operation 402. From this analysis sub-circuits of the various classes are identified; critical analog signal, analog signal, biasing, digital and what doesn't get classed is considered non-critical. These sub-circuits of the analog and critical analog signals contain the signal flow for the topology. The digital portion of the circuit design is identified in operation 406 while the analog/radio frequency portion of the circuit is identified in operation 408.

The critical signal flow requirements are provided in operation 410 of FIG. 5. Exemplary critical signal flow requirements include matching characteristics associated with analog circuits, such as differential pair matching, common centroid constructions and priority ordering of stages in the critical path. In one embodiment, a user will provide the critical signal flow requirements. From these requirements, a core signal flow path is identified in operation 418, while a biasing circuit portion is identified in operation 416. Here again, the critical signal flow requirements are accessed in order to define the respective unit circuits in the corresponding signal flow paths. For example, with regard to the core signal flow path, the unit circuits are defined in operation 422. A unit circuit may refer to a single functional block, i.e., functional block 114a of FIG. 1A. Likewise, for the biasing circuit portion, the unit circuits are defined in operation 424. Physical requirement rules are then accessed in operation 426 and from these rules the requirements for matching, abutment, symmetry and minimizing parasitics are calculated for the core signal flow path in operation 428. Physical requirement rules include differential signal path matching, noise constraints, parasitic minimization parameters and transistor mismatch data. For the biasing circuit portion, the matching, abutment, and symmetry requirements are calculated in operation 430.

Figure 6:
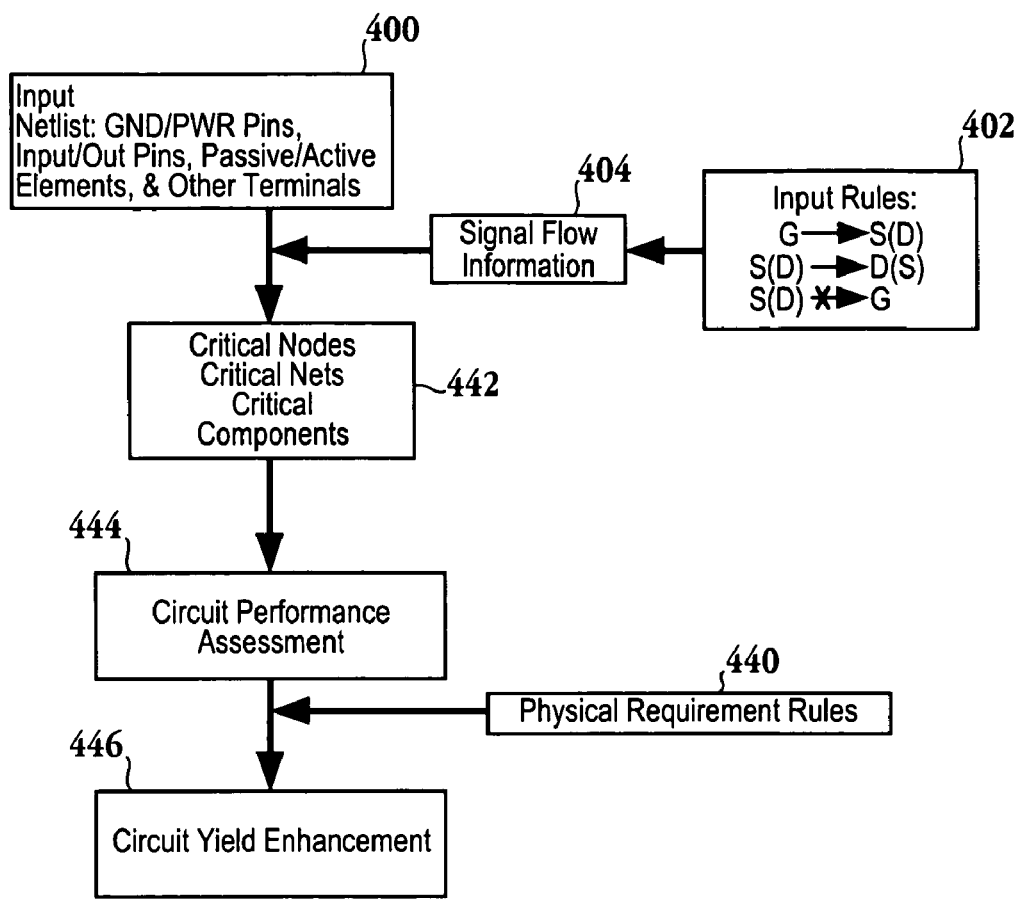
FIG. 6 is a flow chart diagram illustrating the method operations for circuit performance assessment and circuit yielding enhancement in accordance with one embodiment of the invention.

FIG. 6 is a flow chart diagram illustrating the method operations for assessing circuit performance and yield enhancement in accordance with one embodiment of the invention. In operation 400, a netlist is provided in which the ground and power pins, input and output pins, passive and active elements and other terminals will be listed. The input rules are again provided in operation 402 as discussed above with reference to FIG. 4. The signal flow information is then generated in operation 404 and with the output of operation 400, the critical nodes, critical nets, and critical components are identified. The critical nodes refer to source and drain regions as well as gates. Critical nets refer to connectors which may be lines connecting the critical nodes. The critical components refer to the transistors and passive devices in the critical signal flow. Physical requirement rules are provided in operation 440. The physical requirement rules of operation 440 and the output of operation 442 are used to generate circuit performance assessment in operation 444. The circuit performance assessment of operation 444 may be referred to as a sensitivity analysis. That is, slight changes are made to some of the characteristics or the circuit in order to identify the sensitivity to these changes. In operation 446 circuit yield enhancement functionality is provided. Here, the circuit design may be adjusted in order to enhance the yield for a manufacturing operation.

It should be appreciated that various software modules may provide the functionality to generate the layout for an analog circuit design in accordance with one embodiment of the invention. The partitioning of the circuit into digital and analog portions is provided by one module of the software providing the functionality described herein. Signal flow tracking may be performed by a module that starts from the input terminals, and traces the signals through an analog portion of the circuit. The signal flow tracking module will analyze components within a netlist to begin to build a hierarchical tree of the components along a signal path through the analog portion of the circuit. The unit circuit module first produces the characteristic structure information, and then searches the structures for a specified unit circuit. It should be appreciated that pattern matching may be used to determine if the characterized structure matches the unit circuit. In one embodiment, the unit circuit module will locate differential pairs, current sources, and current mirrors. Another module may be referred to as a bias circuit explorer that is configured to identify all the unit circuits to make the bias circuit hierarchy and identify the matching in the bias circuit.

In one embodiment, a bias and core circuit partitioner module partitions an analog/RF circuit into a bias circuit portion and a core circuit portion based on the critical signal tracing, i.e., the signal flow tracing. Here, the analog/RF circuit is re-organized as the instantiations of a bias sub-circuit and a core sub-circuit. Therefore, a circuit will be re-organized as a new hierarchy circuit with logic and analog/RF partitioning, bias and core partitioning, signal path partitioning, unit circuit identified, symmetry and matching identified, etc. This hierarchy can be used for speeding up circuit simulation, circuit optimization, yield improvement, efficiently controlling layout synthesis, circuit physical layout floor panning, and extracting Intellectual Property circuit cell for reuse, among other benefits. Through the embodiments described herein, the analog components may be grouped and presented as a hierarchical tree illustrating subgroups for each group.

As to a further discussion of the manner of usage and operation of the present invention, the same should be apparent from the above description. Accordingly, no further discussion relating to the manner of usage and operation will be provided.

With respect to the above description then, it is to be realized that the optimum dimensional relationships for the parts of the invention, to include variations in size, materials, shape, form, function and manner of operation, assembly and use, are deemed readily apparent and obvious to one skilled in the art, and all equivalent relationships to those illustrated in the drawings and described in the specification are intended to be encompassed by the present invention.

With the above embodiments in mind, it should be understood that the invention may employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

Any of the operations described herein that form part of the invention are useful machine operations. The invention also relates to a device or an apparatus for performing these operations. The apparatus may be specially constructed for the required purposes, or it may be a general-purpose computer selectively activated or configured by a computer program stored in the computer. In particular, various general purpose machines may be used with computer programs written in accordance with the teachings herein, or it may be more convenient to construct a more specialized apparatus to perform the required operations. Additionally, the PLDs according to the present invention may be included in a processor that is part of an electronic system. The electronic system may be a digital computing system such as a general or special purpose computer, or a specialized digital switching network, or other processing system.

The invention can also be embodied as computer readable code on a computer readable medium. The computer readable medium is any data storage device that can store data which can be thereafter read by a computer system. The computer readable medium also includes an electromagnetic carrier wave in which the computer code is embodied. Examples of the computer readable medium include hard drives, network attached storage (NAS), read-only memory, random-access memory, CD-ROMs, CD-Rs, CD-RWs, magnetic tapes, and other optical and non-optical data storage devices. The computer readable medium can also be distributed over a network coupled computer system so that the computer readable code is stored and executed in a distributed fashion.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims. In the claims, elements and/or steps do not imply any particular order of operation, unless explicitly stated in the claims.

Therefore, the foregoing is considered as illustrative only of the principles of the invention. Further, since numerous modifications and changes will readily occur to those skilled in the art, it is not desired to limit the invention to the exact construction and operation shown and described, and accordingly, all suitable modifications and equivalents may be resorted to, falling within the scope of the invention.

The invention claimed is:

1. A method for generating a layout for an analog circuit design, comprising method operations of:
   receiving a set of rules including one or more physical requirement rules defining rules associated with differential signal path matching, parasitic minimization parameters, and transistor mismatch data;
   tracing a signal flow through a circuit netlist;
   partitioning the circuit netlist into a digital portion and an analog portion; and
   defining a signal flow through the analog portion of the circuit netlist based on the set of rules.

2. The method of claim 1, further comprising:
   defining a core signal portion of the analog portion and a bias circuit portion of the analog portion.

3. The method of claim 2, wherein the defining a core signal portion of the analog portion is based on user input.

4. The method of claim 1, further comprising:
   defining a functional block within the analog portion based on the set of rules.

5. The method of claim 4, wherein the functional block is expanded to a complex circuit.

6. The method of claim 1 further comprising:
   grouping components together based on the signal flow through the analog portion of the circuit netlist.

7. The method of claim 1, wherein the method operation of defining a signal flow through the analog portion of the circuit netlist includes,
   identifying input pins to the analog portion;

tracing the signal flow from each of the identified input pins to corresponding output pins according to flow requirements;
subdividing the analog portion into a biasing circuit portion and a core signal portion; and
grouping common components of the core signal portion.

8. The method of claim 1, wherein each of the method operations are embodied as program instructions on a computer readable medium.

9. The method of claim 1, wherein the method operation of defining a signal flow through the analog portion of the circuit netlist includes,
generating a hierarchical tree of components being grouped together based on the signal flow.

10. A method for automatic generation of an analog portion of a circuit for physical synthesis, comprising method operations of:
receiving a set of rules including one or more physical requirement rules defining rules associated with differential signal path matching, parasitic minimization parameters, and transistor mismatch data;
partitioning a netlist into a digital portion and an analog portion; and
grouping components of the analog portion together based on a signal path defined in response to the set of rules through the analog portion of the netlist.

11. The method of claim 10, wherein the method operation of grouping components of the analog portion together based on a signal path trace includes,
tracing the signal path through the analog portion.

12. The method of claim 11, further comprising:
performing pattern matching to identify differential pairs, current sources and current mirrors within the analog portion.

13. The method of claim 10, farther comprising:
generating a hierarchical tree according to the grouping of components.

14. A system for characterizing a circuit design having an analog circuit portion and a digital circuit portion, comprising:
a rules module for storing rules, wherein the rules include physical requirement rules defining rules associated with differential signal path matching, parasitic minimization parameters, and transistor mismatch data;
a signal flow tracking module configured to trace a signal flow through the analog circuit portion; and
a unit circuit module configured to characterize structure associated with the signal flow through the analog circuit portion and determine if the characterized structure matches a unit circuit.

15. The system of claim 14, wherein the unit circuit module is further configured to perform pattern matching to determine if the characterized structure matches the unit circuit.

16. The system of claim 14, wherein the unit circuit module is configured to locate differential pairs, current sources, and current mirrors, and wherein the system further includes a bias circuit explorer configured to define a bias circuit hierarchy for a bias circuit of the analog circuit portion.

17. The system of claim 14, wherein the signal flow tracking module traces signals for a metal oxide semiconductor field effect transistor from a gate to one of a source or a drain, from the drain to the source, and from the source to the drain.

18. The system of claim 14, wherein the signal flow tracking module traces signals for one of a resistor or a capacitor from a first terminal to a second terminal.

* * * * *